(12) United States Patent
Voronin et al.

(10) Patent No.: US 10,529,540 B2
(45) Date of Patent: Jan. 7, 2020

(54) ADVANCED METHODS FOR PLASMA SYSTEMS OPERATION

(71) Applicant: Tokyo Electron Limited, Tokyo (JP)

(72) Inventors: Sergey Voronin, Albany, NY (US); Christopher Talone, Albany, NY (US); Alok Ranjan, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/939,835

(22) Filed: Mar. 29, 2018

(65) Prior Publication Data

US 2019/0304750 A1 Oct. 3, 2019

(51) Int. Cl.
*H01J 37/00* (2006.01)
*H01J 37/32* (2006.01)

(52) U.S. Cl.
CPC ........ *H01J 37/321* (2013.01); *H01J 37/3244* (2013.01); *H01J 37/32137* (2013.01); *H01J 37/32458* (2013.01)

(58) Field of Classification Search
CPC ............... H01J 37/321; H01J 37/32137; H01J 37/3244; H01J 37/32458
USPC ................................ 250/492.1, 492.2, 492.3
See application file for complete search history.

(56) References Cited

U.S. PATENT DOCUMENTS

| 2015/0041432 A1* | 2/2015 | Chen | H01J 37/3233 216/66 |
| 2017/0176349 A1* | 6/2017 | Gopalan | G01N 22/00 |

\* cited by examiner

*Primary Examiner* — Nicole M Ippolito
(74) *Attorney, Agent, or Firm* — Oblon, McClelland, Maier & Neustadt, L.L.P.

(57) ABSTRACT

Methods and systems for treating a substrate are described. In an embodiment, a method may include receiving a microelectronic substrate in a plasma processing chamber. A method may also include receiving process gas in the plasma processing chamber. Additionally, a method may include applying energy to the process gas with a first energy source and applying energy to the process gas with a second energy source. The method may further include selectively adjusting at least one of the first energy source and the second energy source between a first state and a second state.

20 Claims, 9 Drawing Sheets

ADVANCED METHODS FOR PLASMA SYSTEMS OPERATION

FIELD OF USE

The present invention relates to systems and methods for substrate processing, and more particularly to a method and system for advanced methods for plasma systems operation.

BACKGROUND

Substrate processing includes various process steps, each performed by a set of substrate processing tools, which yield a micromechanical, microelectrical, microelectromechanical (MEMS), or nano-scale device. Substrate processing steps often include operations such as substrate washing, substrate coating, substrate etching, substrate baking, etc. A variety of substrate processing tools are used to perform the various substrate processing steps, including substrate etch tools for etching processes. Substrate etch tools include ion etch tools, sometimes referred to as Reactive Ion Etch (RIE) or Dry Reactive Ion Etch (DRIE) tools. Ion etch tools come in many varieties, including Inductively Coupled Plasma (ICP) systems and Surface Wave (SW) systems.

Ion etch tools may be used to perform many of the substrate processing steps, including patterning of coatings formed on the surface of the substrate, trench or feature formation, pre-treatment and post-treatment processes, etch. An ion etch tool generally operates by forming a plasma field in a substrate processing chamber. The plasma field contains ions which interact with the surface of the substrate in various ways. Additionally, the plasma may include radicals in some cases, which may react with the surface of the substrate in other ways. The plasma field is formed by charging a gas chemistry with RF energy from an RF energy source.

In RIE systems, the substrate rests on a bias electrode which is charged by a second power source, commonly referred to as a "bias source." The bias source may supply energy for accelerating the electrode in the direction of the surface of the substrate at a certain kinetic energy level. When the ions and/or radicals strike the surface of the substrate, they interact with the surface of the substrate. For example, the ions may strike the surface of the substrate and thereby remove portions of the surface of the substrate for patterning or material removal. Many other processing steps may be performed on the substrate in similar fashion and by similar systems.

Certain processing objectives are to be achieved in each processing step. Processing objectives include etching to a predetermined depth, etching features of a predetermined size, etching one material with a predetermined selectivity to another material, etc. In prior systems, the processing settings are entered prior to initiation of the processing step. The settings may be changed or a subsequent step, but that typically requires stopping the first processing step, possibly removing the substrate from the chamber, modifying the settings and initiating the new processing step. Such a process is often time consuming and may result in low yield rates, contamination of the substrate, delays, and additional costs. Additionally, prior processing systems do not have the flexibility to dynamically alter processing parameters.

Furthermore, industry drive toward smaller feature sizes has highlighted processing problems during gate etch. Non-volatile polymer is an etch by-product that deposits on the chamber wall, that may be desorbed into the plasma during the etch process, and that may be deposited back on to the wafer in the form of a film. In systems where feature size objectives are greater than 25 nm, the film does not block features, but in sub-25 nm systems, the film may obstruct or otherwise degrade the features.

SUMMARY OF THE INVENTION

Methods and systems for treating a substrate are described. In an embodiment, a method may include receiving a microelectronic substrate in a plasma processing chamber. A method may also include receiving process gas in the plasma processing chamber. Additionally, a method may include applying energy to the process gas with a first energy source and applying energy to the process gas with a second energy source. The method may further include selectively adjusting at least one of the first energy source and the second energy source between a first state and a second state.

In an embodiment, a system may include a plasma processing chamber configured to receive a microelectronic substrate. A system may also include a gas distribution system configured to dispense process gas in the plasma processing chamber. Additionally, a system may include a first energy source configured to apply energy to the process gas, and a second energy source configured to apply energy to the process gas. Embodiments may also include a controller coupled to the first energy source and the second energy source and configured to selectively adjust at least one of the first energy source and the second energy source between a first state and a second state.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

DETAILED DESCRIPTION

Figure 1:
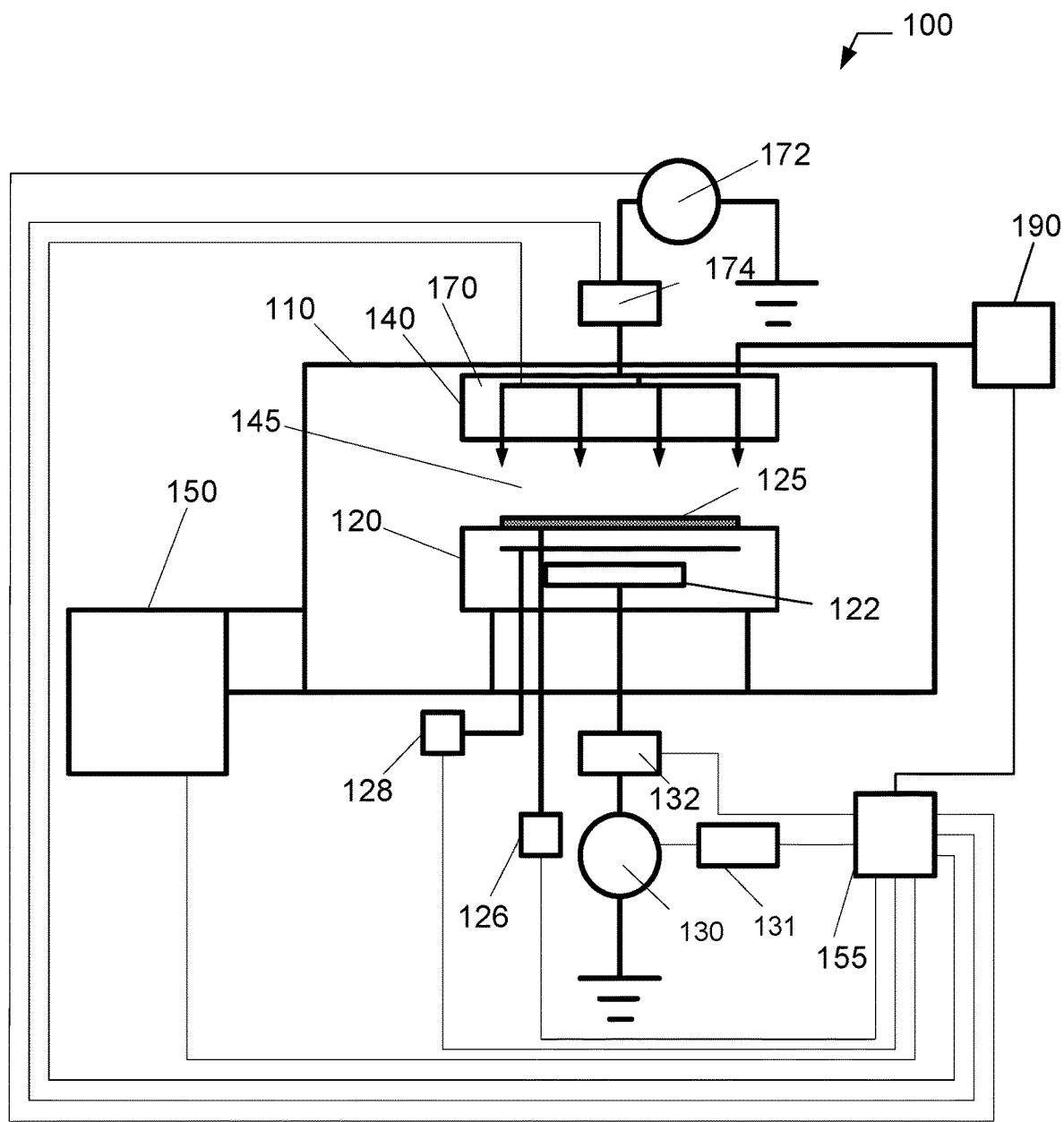
FIG. 1 is a schematic system diagram illustrating one embodiment of a system for treating a substrate.

Methods and systems for treating a substrate are presented. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

FIG. 1 is an embodiment of a system 100 for surface restoration for nitride etching. In a further embodiment, the system may be configured to perform surface restoration for nitride etching as described with reference to FIGS. 2A-8D. An etch and post heat treatment system 100 configured to perform the above identified process conditions is depicted in FIG. 1 comprising a processing chamber 110, substrate holder 120, upon which a wafer 125 to be processed is affixed, and vacuum pumping system 150. The wafer 125 can be a semiconductor substrate, a wafer, a flat panel display, or a liquid crystal display. Processing chamber 110 can be configured to facilitate etching the processing region 145 in the vicinity of a surface of the wafer 125. An ionizable gas or mixture of process gases is introduced via a gas distribution system 140. For a given flow of process gas, the process pressure is adjusted using the vacuum pumping system 150.

The wafer 125 can be affixed to the substrate holder 120 via a clamping system (not shown), such as a mechanical clamping system or an electrical clamping system (e.g., an electrostatic clamping system). Furthermore, substrate holder 120 can include a heating system (not shown) or a cooling system (not shown) that is configured to adjust and/or control the temperature of substrate holder 120 and the wafer 125. The heating system or cooling system may comprise a re-circulating flow of heat transfer fluid that receives heat from substrate holder 120 and transfers heat to a heat exchanger system (not shown) when cooling, or transfers heat from the heat exchanger system to substrate holder 120 when heating. In other embodiments, heating/cooling elements, such as resistive heating elements, or thermo-electric heaters/coolers can be included in the substrate holder 120, as well as the chamber wall of the processing chamber 110 and any other component within the processing system 100.

Additionally, a heat transfer gas can be delivered to the backside of wafer 125 via a backside gas supply system 126 in order to improve the gas-gap thermal conductance between wafer 125 and substrate holder 120. Such a system can be utilized when temperature control of the wafer 125 is required at elevated or reduced temperatures. For example, the backside gas supply system can comprise a two-zone gas distribution system, wherein the helium gas-gap pressure can be independently varied between the center and the edge of wafer 125.

In the embodiment shown in FIG. 1, substrate holder 120 can comprise an electrode 122 through which RF power is coupled to the processing region 145. For example, substrate holder 120 can be electrically biased at a RF voltage via the transmission of RF power from a RF generator 130 through an optional impedance match network 132 to substrate holder 120. The RF electrical bias can serve to heat electrons to form and maintain plasma. In this configuration, the system 100 can operate as an RIE reactor, wherein the chamber and an upper gas injection electrode serve as ground surfaces.

Furthermore, the electrical bias of electrode 122 at a RF voltage may be pulsed using pulsed bias signal controller 131. The RF power output from the RF generator 130 may be pulsed between an off-state and an on-state, for example. Alternately, RF power is applied to the substrate holder electrode at multiple frequencies. Furthermore, impedance match network 132 can improve the transfer of RF power to plasma in plasma processing chamber 110 by reducing the reflected power. Match network topologies (e.g. L-type, π-type, T-type, etc.) and automatic control methods are well known to those skilled in the art.

Gas distribution system 140 may comprise a showerhead design for introducing a mixture of process gases. Alternatively, gas distribution system 140 may comprise a multi-zone showerhead design for introducing a mixture of process gases, and adjusting the distribution of the mixture of process gases above wafer 125. For example, the multi-zone showerhead design may be configured to adjust the process gas flow or composition to a substantially peripheral region above wafer 125 relative to the amount of process gas flow or composition to a substantially central region above wafer 125. In such an embodiment, gases may be dispensed in a suitable combination to form a highly uniform plasma within the chamber 110.

Vacuum pumping system 150 can include a turbo-molecular vacuum pump (TMP) capable of a pumping speed up to about 8000 liters per second (and greater) and a gate valve for throttling the chamber pressure. In conventional plasma processing devices utilized for dry plasma etching, an 800 to 3000 liter per second TMP can be employed. TMPs are useful for low pressure processing, typically less than about 50 mTorr. For high pressure processing (i.e., greater than about 80 mTorr), a mechanical booster pump and dry roughing pump can be used. Furthermore, a device for monitoring chamber pressure (not shown) can be coupled to the plasma processing chamber 110.

In an embodiment, the source controller 155 can comprise a microprocessor, memory, and a digital I/O port capable of generating control voltages sufficient to communicate and activate inputs to processing system 100 as well as monitor outputs from plasma processing system 100. Moreover, source controller 155 can be coupled to and can exchange information with RF generator 130, pulsed bias signal controller 131, impedance match network 132, the gas distribution system 140, the gas supply 190, vacuum pumping system 150, as well as the substrate heating/cooling system (not shown), the backside gas supply system 126, and/or the electrostatic clamping system 128. For example, a program stored in the memory can be utilized to activate the inputs to the aforementioned components of processing system 100 according to a process recipe in order to perform a plasma assisted process, such as a plasma etch process or a post heating treatment process, on wafer 125.

In addition, the processing system 100 can further comprise an upper electrode 170 to which RF power can be coupled from RF generator 172 through optional impedance match network 174. A frequency for the application of RF power to the upper electrode can range from about 0.1 MHz to about 200 MHz, in one embodiment. Alternatively, the present embodiments may be used in connection with Inductively Coupled Plasma (ICP) sources, Capacitive Coupled Plasma (CCP) sources, Surface Wave Plasma (SWP) sources configured to operate in GHz frequency ranges, Electron Cyclotron Resonance (ECR) sources configured to operate in sub-GHz to GHz ranges, and others. Additionally, a frequency for the application of power to the lower electrode can range from about 0.1 MHz to about 80 MHz. Moreover, source controller 155 is coupled to power generator 172 and impedance match network 174 in order to control the application of RF power to upper electrode 170. In an embodiment the power generator 172 is an RF generator. Alternatively, the power generator 172 is a microwave power source. The design and implementation of an upper electrode is well known to those skilled in the art. The upper electrode 170 and the gas distribution system 140 can be designed within the same chamber assembly, as shown. Alternatively, upper electrode 170 may comprise a multi-zone electrode design for adjusting the RF power distribution coupled to plasma above wafer 125. For example, the upper electrode 170 may be segmented into a center electrode and an edge electrode.

Depending on the applications, additional devices such as sensors or metrology devices can be coupled to the processing chamber 110 and to the source controller 155 to collect real time data and use such real time data to concurrently control two or more selected integration operating variables in two or more steps involving deposition processes, RIE processes, pull processes, profile reformation processes, heating treatment processes and/or pattern transfer processes of the integration scheme. Furthermore, the same data can be used to ensure integration targets including completion of post heat treatment, patterning uniformity (uniformity), pull-down of structures (pulldown), slimming of structures (slimming), aspect ratio of structures (aspect ratio), line width roughness, substrate throughput, cost of ownership, and the like are achieved.

By modulating the applied power, typically through variation of the pulse frequency and duty ratio, it is possible to obtain markedly different plasma properties from those produced in continuous wave (CW). Consequently, RF power modulation of the electrodes can provide control over time-averaged ion flux and the ion energy.

Figures 2A, 2B:
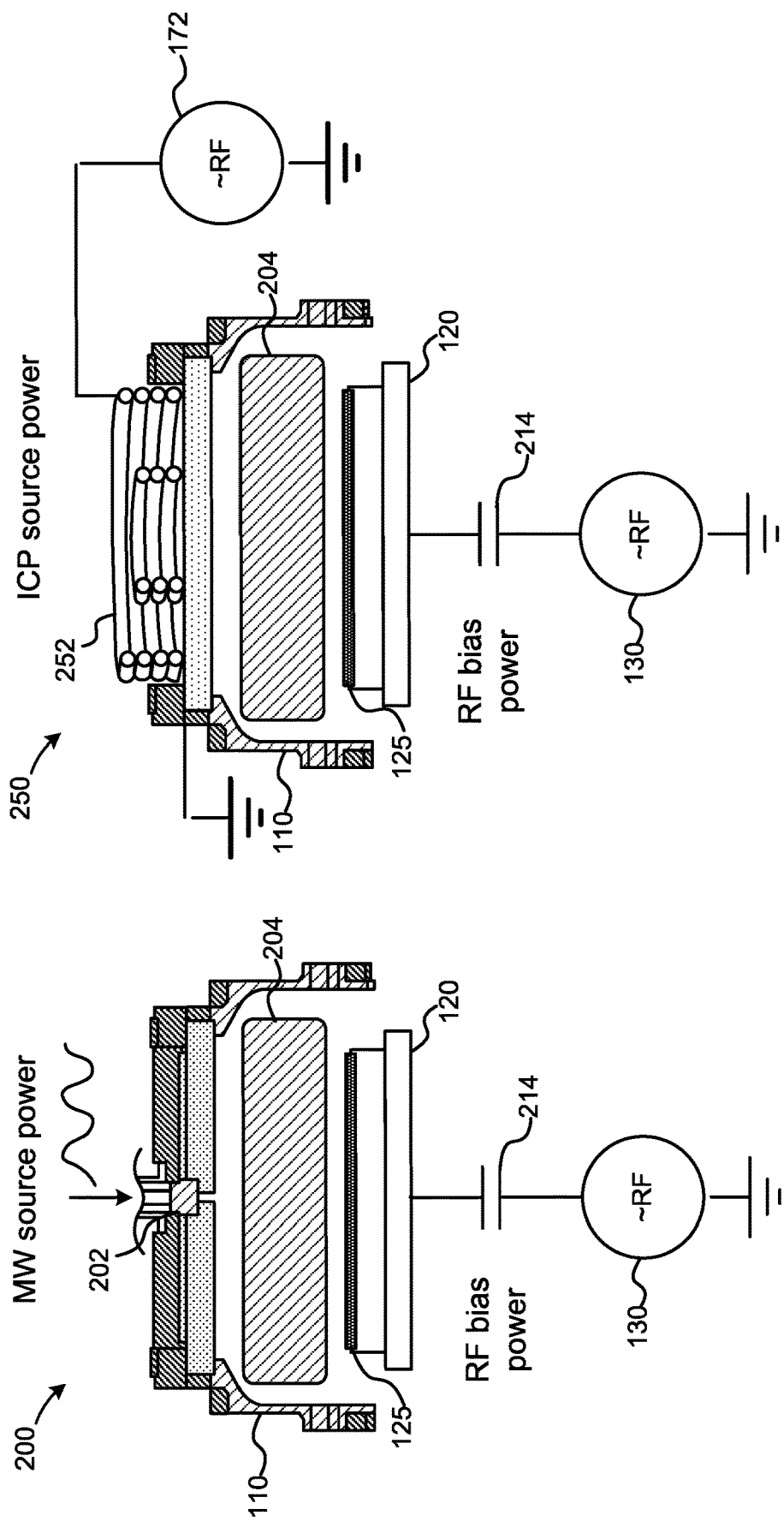
FIG. 2A illustrates one embodiment of a system for treating a substrate.
FIG. 2B illustrates another embodiment of a system for treating a substrate.

The embodiments of FIGS. 2A-2B illustrate alternative configurations of the system described with reference to FIG. 1. As such, some of the details of FIG. 1 have been omitted or illustrated differently for the purpose of highlighting the configuration differences. One of ordinary skill will recognize that some or all of the components of the system 100 of FIG. 1 may also be incorporated with the embodiments of FIGS. 2A-2B.

FIG. 2A illustrates a surface wave plasma system 200. In the embodiment of FIG. 2A, the surface wave plasma system 200 may include a microwave power source 202. The microwave power source 202 may energize gas in the processing chamber 110 to form a bulk plasma 204 for processing the wafer 125. In such an embodiment, the impedance matching network 132 may include a capacitive element 214. The RF generator 130 may provide a bias energy to the wafer 125 causing directional energy to elements of the plasma 204, such as ions and radicals. The surface wave plasma system 200 may receive the wafer 125 with a substrate holder 120.

FIG. 2B illustrates an inductively coupled plasma system 250. In the embodiment of FIG. 2B, the Power generator 172 may supply power to an inductively coupled power source 252. In the illustrated embodiment, the inductively coupled power source 252 may include inductive antenna elements, for example. The inductively coupled power source 252 may energize the gas in the processing chamber 110 to form a plasma field 204 for processing the wafer 125. As with the embodiment of FIG. 2A, a bias energy may be applied by RF generator 130. The inductively coupled plasma system 200 may receive the wafer 125 with a substrate holder 120.

Figure 3A:
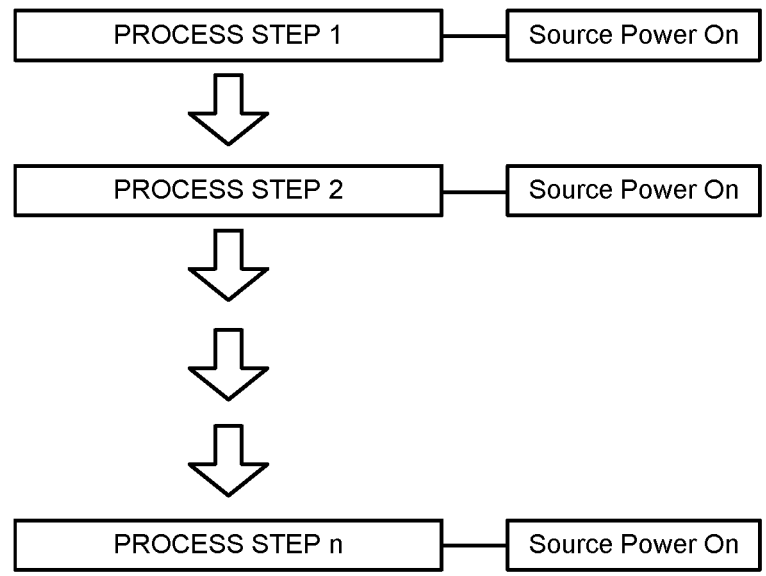
FIG. 3A illustrates one embodiment of a process flow diagram illustrating one embodiment of a method for treating a substrate.

The embodiment of FIG. 3A illustrates a processing flow that may be performed by, for example, the system of FIG. 1. The processing flow may include multiple processing steps (1-n), each of which may occur inside the processing system of FIG. 1. In such an embodiment, each step of the process may operate in a non-capacitively coupled (CCP) plasma mode only.

Figure 3B:
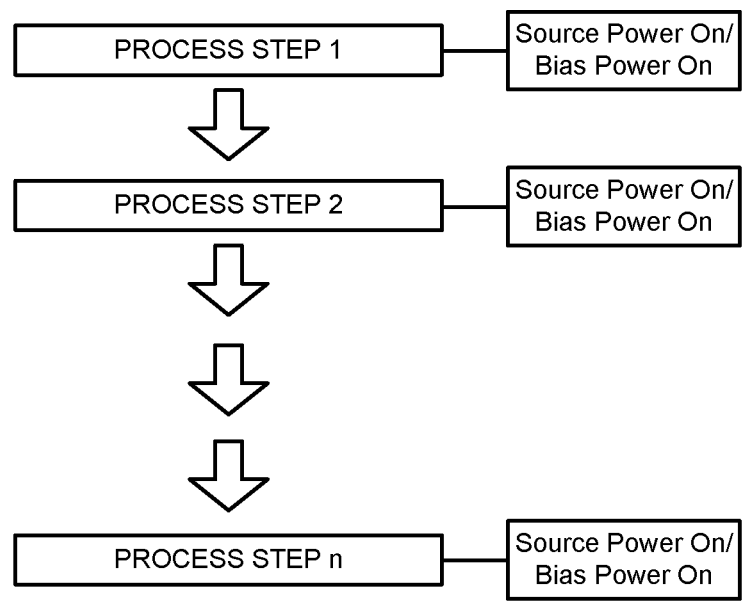
FIG. 3B illustrates another embodiment of a process flow diagram illustrating another embodiment of a method for treating a substrate.

By contract, the process flow illustrated in FIG. 3B illustrates that the present embodiments may enable selectable operation between non-CCP mode and a capacitive operating mode, depending upon target processing objectives for each step. In an embodiment, the system 100 may operate in CCP mode by using a capacitively coupled power source. Alternatively, the system 100 may operate in CCP mode by switching off the microwave power source 202, the ICP source 252, etc., while bias source on. The system 100 may operate in non-CCP mode (e.g., inductive mode) with the ICP source 252 switched on. In such an embodiment, the bias electrode 122 may be either switched on or switched off, depending upon processing objectives.

Figure 4A:
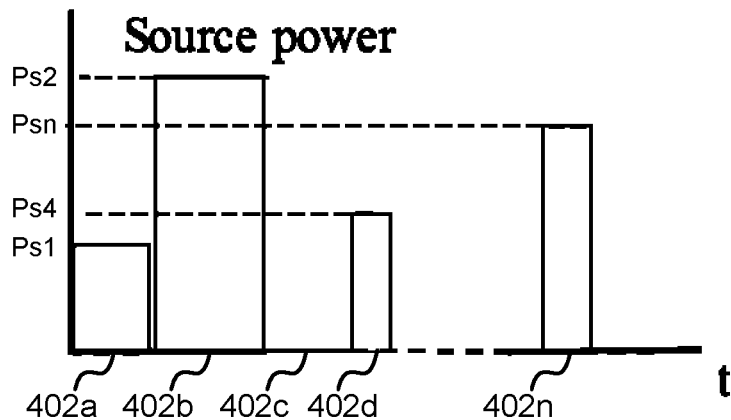
FIG. 4A is a timing diagram illustrating one embodiment of a method for treating a substrate.
Figure 4B:
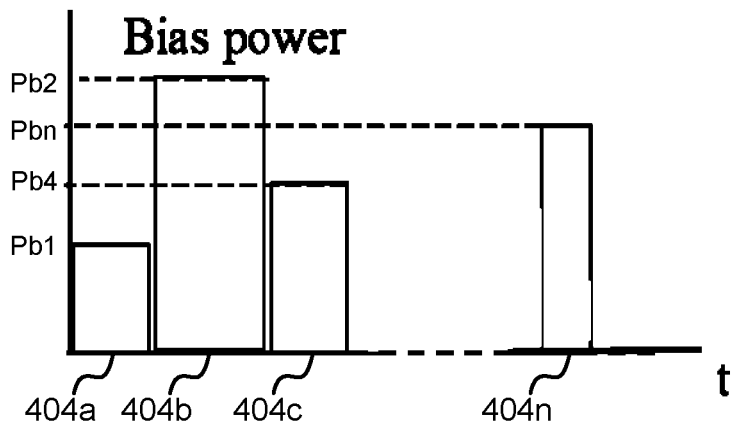
FIG. 4B is a timing diagram illustrating one embodiment of a method for treating a substrate.
Figure 4C:
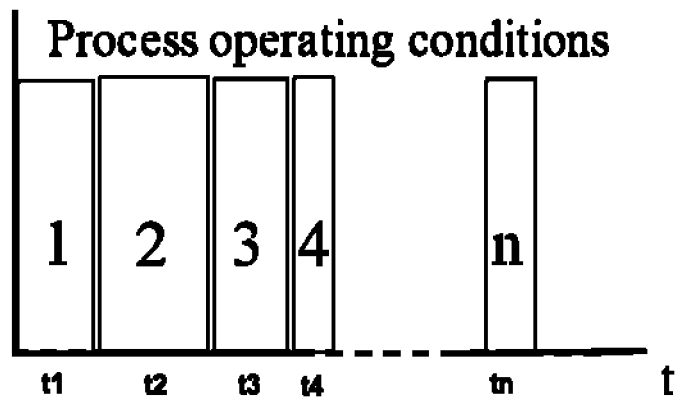
FIG. 4C is a timing diagram illustrating one embodiment of a method for treating a substrate.

FIGS. 4A-4C illustrate various alternative operating conditions that may be altered or adjusted to meet processing objectives for each of the various processing steps illustrated in FIG. 3B. In the embodiment of FIG. 4A the amplitude of the source power emitted by the power generator 172 may be adjusted to one or more variable power levels. In one embodiment, the source power is turned on to a predetermined level or turned off. Alternatively, the power level may be adjusted to one of a plurality of power levels as shown in FIG. 4A by steps 402a-n.

FIG. 4B illustrates an embodiment in which the bias power level produced by the RF generator 130 may be adjusted. Similarly, the bias power may be turned on to a predetermined level or switched off. In another embodiment, the bias power may be adjusted to one of a plurality of power levels.

FIG. 4C illustrates embodiments where the power level may not change, but the duration of operation may be variable. In further embodiments, duration and power level may be independently varied to meet processing objectives. In still further embodiments, other processing parameters may be varied, either independently or in combination with duration and power level, including frequency of the power supplied by the power generator 172, etc.

FIGS. 5A-5D illustrate an embodiment of a processing flow used for generating a microelectronic or micromechanical device. In such an embodiment the surface wave source 202 or inductively coupled source 252 is always on during the wafer processing steps. By comparison, the process of FIGS. 6A-6D illustrates the same process, but with selective application of power from the surface wave source 202 or inductively coupled source 252. Thus, the results of selective source control methods described herein may be compared with a process that does not use selective source control.

In the embodiment of FIGS. 5A-5D, the microwave or surface wave power source is always on. In the process step of FIG. 5A, a wafer 125 comprising a workpiece may be received in a processing chamber 110. In such an embodiment, the workpiece may include a bulk substrate 502, comprising for example, silicon. A stopping layer 504 may be formed thereon. In one embodiment, the stopping layer 504 may be an oxide layer, but one of ordinary skill will recognize a variety of suitable stopping layers materials. Additionally, a silicon (Si) stack 506 may be formed on the stopping layer 504, and device structure 508 may be formed in the aSi stack 506. In the embodiment the device structure 508 is a FIN associated with a FINFet transistor device. In an embodiment, the Si stack 506 may include amorphous silicon (aSi). A hard mask layer 510 may be formed on the aSi stack 506, which may define one or more physical structures to be formed in the Si layer 506.

Figure 5A:
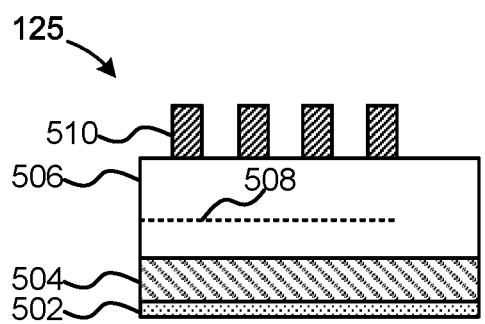
FIG. 5A is a cross-section diagram illustrating one embodiment of a process flow.
Figure 5B:
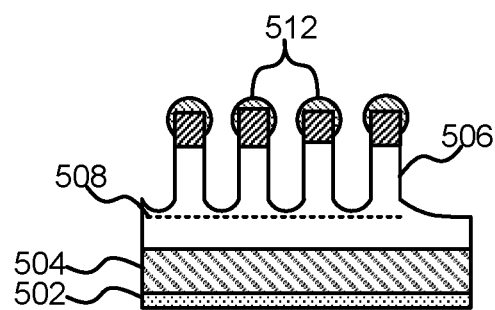
FIG. 5B is a cross-section diagram illustrating one embodiment of a process flow.

FIG. 5B illustrates a first etch process. During operation of prior systems, the microwave power is always on. Because the microwave power is always on, a buildup of byproduct 512 may form on the hard mask layer 510. Further details of the buildup mechanisms are described with relation to FIG. 10A.

Figure 5C:
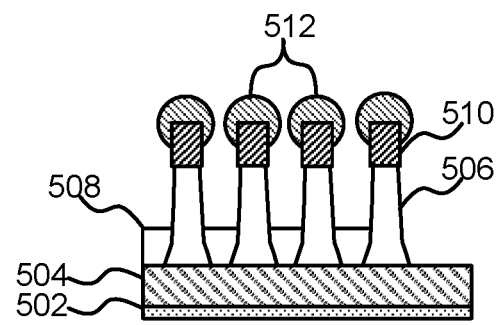
FIG. 5C is a cross-section diagram illustrating one embodiment of a process flow.
Figure 7:
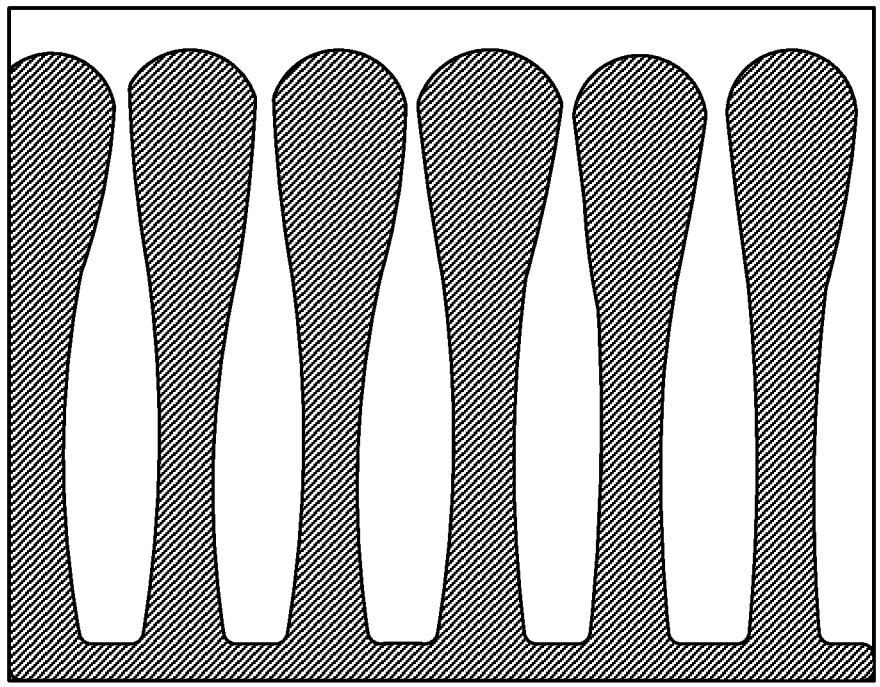
FIG. 7 is a cross-section diagram illustrating one embodiment of a result of the process of FIGS. 5A-5D.

FIG. 5C illustrates a soft-landing step, wherein the device feature 508 is etched. In the soft landing etch process, a further layer of the etch byproduct 512 may be formed on the top of the hard mask layer 510. In an embodiment, the byproduct 512 may be non-volatile SiBrO, where HBr is used as a major etch precursor. In such an embodiment, the byproduct 512 may be produced because of a radical-deficient operating regime and re-dissociation of volatile SiBr4 species in the plasma when the high density plasma source is always on. In some embodiments, the byproduct 512 may cause blockage between features, thereby limiting the further etch processes. Additionally, the capacitively coupled etch steps may not be sufficiently selective to form the device features without substantial underetch. An example of a product produced by the process of FIGS. 5A-5D is shown in FIG. 7.

FIGS. 6A-6D illustrate an embodiment of a processing flow used for generating a semiconductor device. In such an embodiment the variable power supply process described in FIGS. 4A-4C may be used to form portions of a semiconductor device. In the process step of FIG. 6A, a wafer 125 comprising a workpiece may be received in a processing chamber 110, the workpiece including layers described above with relation to FIG. 5A.

Figure 6A:
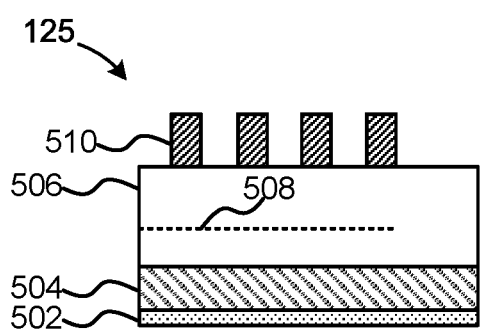
FIG. 6A is a cross-section diagram illustrating one embodiment of a process flow.
Figure 6B:
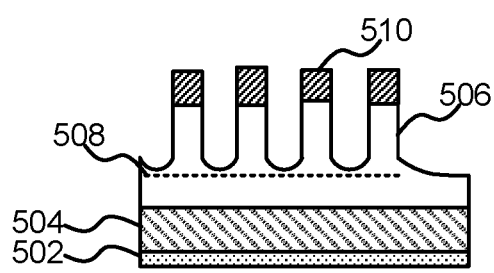
FIG. 6B is a cross-section diagram illustrating one embodiment of a process flow.

The processing step of FIG. 6B may be performed with a capacitively coupled process, which may produce a relatively small amount of non-volatile byproduct 512, yield rapid etch results, but have low selectivity to the materials of the device features 508 due to the high ion energy. The CCP mode process may be accomplished by switching off main microwave power source 202 or ICP power source 252. In the step of FIG. 6B, the main etch process may open features in the aSi stack 506 in a pattern defined by the hard mask layer 510. In the step of 5B, the etch may be performed with a capacitively coupled etch process. The etch process of FIG. 5B may continue until the device feature 508 is exposed. In such an embodiment, the capacitively coupled etch process may reduce or eliminate buildup of an etch byproduct 512 on the hard mask layer 510 during the main etch process. Further details of the byproduct reduction mechanisms are described with relation to FIG. 10B.

In an alternative embodiment, the magnitude of power produced by the microwave power source 202 or ICP power source 252 may be reduced, rather than switched off, as shown in FIG. 4A. The temporal duration of certain operating conditions may also be varied according to some embodiments, as illustrated in FIG. 4C.

Figure 5D:
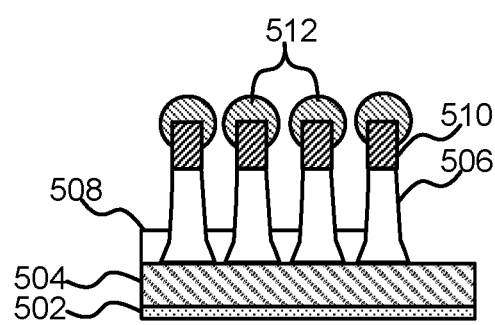
FIG. 5D is a cross-section diagram illustrating one embodiment of a process flow.
Figure 6C:
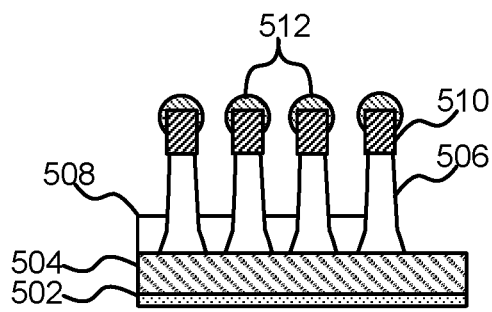
FIG. 6C is a cross-section diagram illustrating one embodiment of a process flow.
Figure 6D:
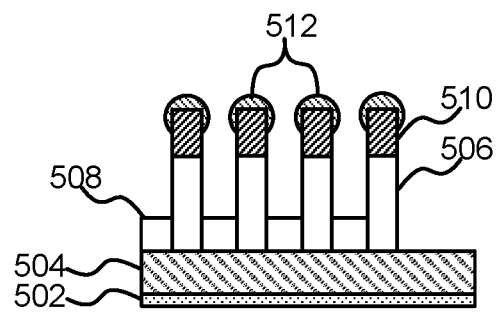
FIG. 6D is a cross-section diagram illustrating one embodiment of a process flow.
Figure 8:
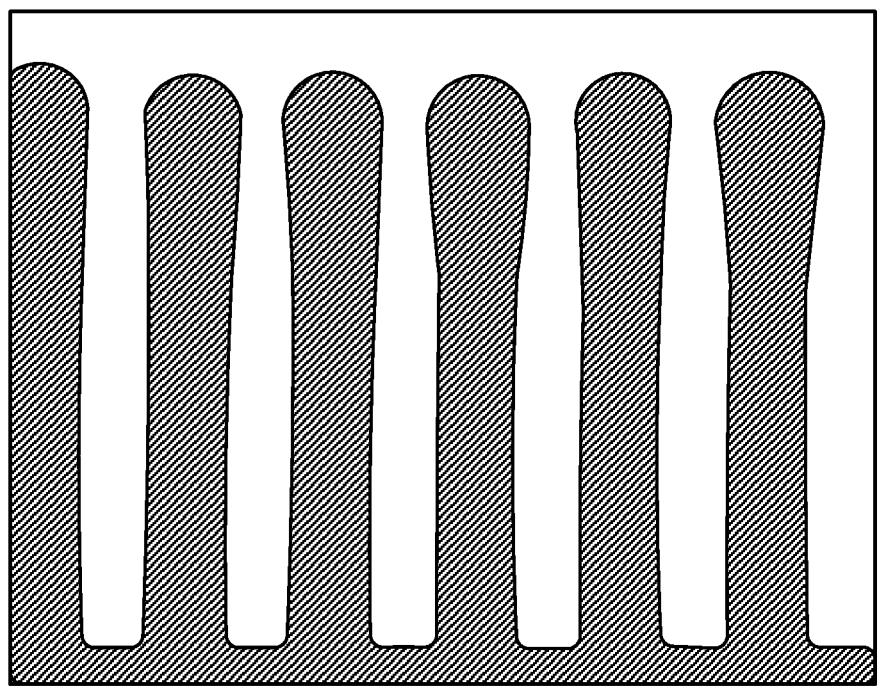
FIG. 8 is a cross-section diagram illustrating one embodiment of a result of the process of FIGS. 6A-6D.

Although some buildup of byproduct 512 may be formed during the processing steps of FIGS. 6C and 6D, the resulting occlusion of features may be significantly less than in the corresponding steps of FIGS. 5C and 5D, because the initial buildup during the main etch process is reduced by operating in CCP mode. Accordingly, the resultant features may be formed with improved quality as compared with the processes of FIGS. 5A-5C. An example of a product produced by the process of FIGS. 6A-6D is shown in FIG. 8, which shows greater uniformity of the resultant features, with improved CD.

Figure 9:
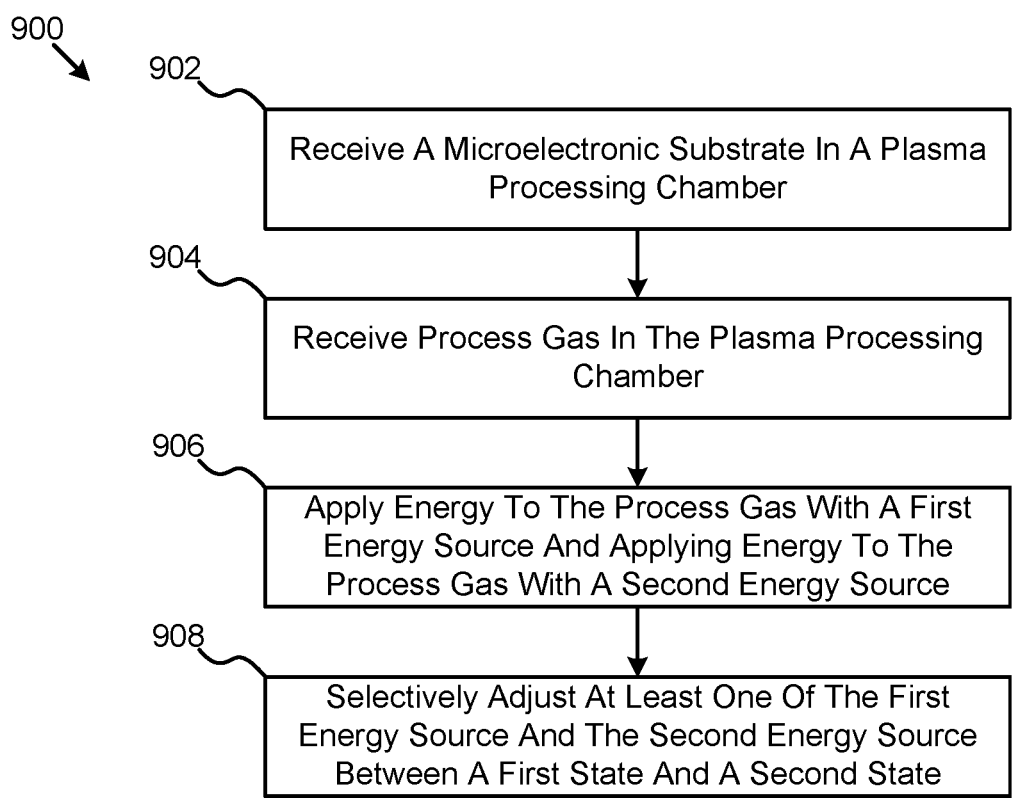
FIG. 9 is a schematic flowchart diagram illustrating one embodiment of a method for treating a substrate.

FIG. 9 illustrates a method 900 for advanced methods for plasma systems operation. In an embodiment, the method 900 includes receiving a microelectronic substrate in a plasma processing chamber as shown at block 902. At block 904, the method 900 includes receiving process gas in the plasma processing chamber. The method 900 also includes applying energy to the process gas with a first energy source and applying energy to the process gas with a second energy source as shown at block 906. At block 908, the method includes selectively adjusting at least one of the first energy source and the second energy source between a first state and a second state.

Figure 10A:
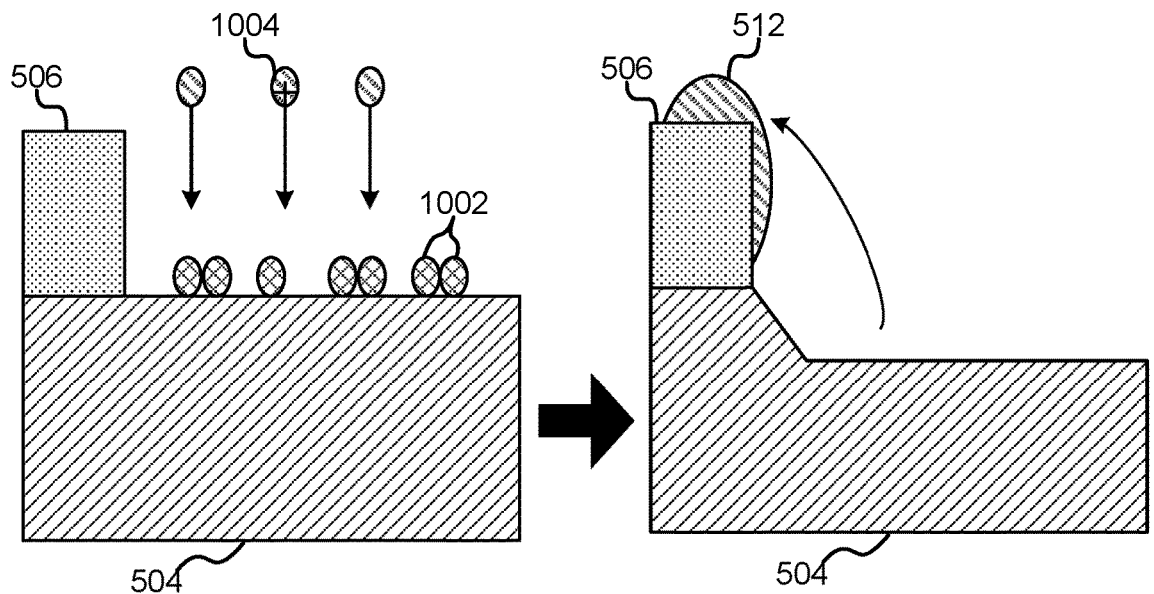
FIG. 10A is a cross-section diagram illustrating one embodiment of a processing flow in which a byproduct is produced on a feature of a substrate.

FIG. 10A illustrates a mechanism for buildup of byproduct 512. As illustrated, both the embodiments of FIGS. 10A and 10B include a silicon stack 506 formed on a stopping layer 504. During the etch processes, the silicon may combine with ions 1004 in the etch plasma forming molecules of volatile byproduct material, such as $SiBr_4$ in some embodiments. When high plasma density source is on, the radical to ion density ratio in the plasma may be reduced. In such an embodiment, the radical deficient regime results in formation of reactive species in the form of $SiBr_x$ (x=1,2) which lead to formation of SiBrO build-up, forming the layer of byproduct 512 on the silicon stack 506.

Figure 10B:
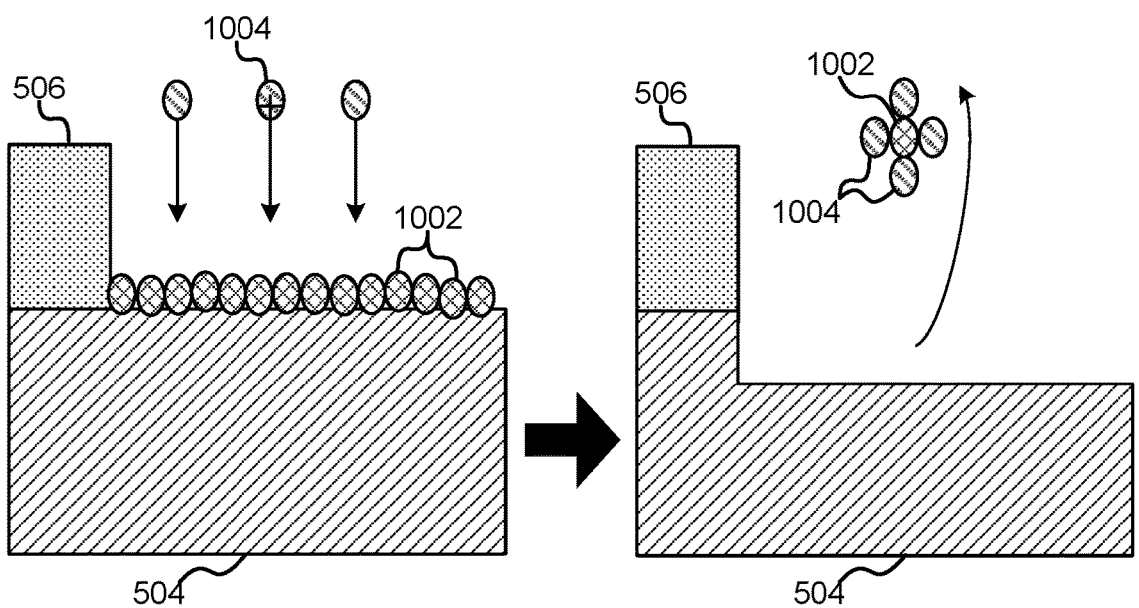
FIG. 10B is a cross-section diagram illustrating one embodiment of a processing flow that includes mitigation of byproduct buildup on a feature of a substrate.

In the embodiment of FIG. 10B, however, the CCP mode plasma may be radical-rich, resulting in leaner etching of the material with small amounts of by-product deposition.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What we claim:

1. A method for treating a substrate, comprising:
   receiving a microelectronic substrate in a plasma processing chamber;
   receiving process gas in the plasma processing chamber;
   applying energy to the process gas with a first energy source and applying energy to the process gas with a second energy source thereby forming a plasma; and
   selectively adjusting at least one of the first energy source and the second energy source between a first state and a second state,
   wherein the substrate is treated with the plasma that has been applied with energy from the first energy source and energy from the second energy source.

2. The method of claim 1, wherein the first energy source is a Surface Wave (SW) power source.

3. The method of claim 2, wherein the SW power source is a microwave or Radio Frequency (RF) power source.

4. The method of claim 1, wherein the first energy source is an inductively coupled power source.

5. The method of claim 4, wherein the inductively coupled power source is a Radio Frequency (RF) power source.

6. The method of claim 1, wherein the second energy source is a substrate bias source.

7. The method of claim 6, wherein the substrate bias source is a Radio Frequency (RF) power source.

8. The method of claim 1, further comprising selectively adjusting at least one of the first energy source and the second energy source to one of a plurality of states.

9. The method of claim 8, wherein at least two of the plurality of states are active states.

10. The method of claim 1, wherein selectively adjusting further comprises adjusting a power output magnitude from a first output magnitude level to a second output magnitude level.

11. The method of claim 1, wherein selectively adjusting further comprises adjusting a power output frequency.

12. The method of claim 1, wherein selectively adjusting further comprises selectively switching at least one of the first energy source and the second energy source between an active state and an inactive state.

13. The method of claim 1, wherein selectively adjusting further comprises adjusting at least one of the first energy source and the second energy source from the first state to the second state for a selectable duration of time.

14. The method of claim 13, wherein the selectable duration of time is selected from one of a plurality of predetermined time periods.

15. The method of claim 13, wherein the selectable duration is selected according to target processing objectives.

16. A system for treating a substrate, comprising:
   a plasma processing chamber configured to receive a microelectronic substrate;
   a gas distribution system configured to dispense process gas in the plasma processing chamber;
   a first energy source configured to apply energy to the process gas;
   a second energy source configured to apply energy to the process gas; and
   a controller coupled to the first energy source and the second energy source and configured to selectively adjust at least one of the first energy source and the second energy source between a first state and a second state,
   wherein the process gas is applied with energy from the first energy source and energy from the second energy source to form a plasma, and
   wherein the substrate is treated with the plasma.

17. The system of claim 16, wherein the first energy source is a Surface Wave (SW) power source.

18. The system of claim 16, wherein the first energy source is an inductively coupled power source.

19. The system of claim 16, wherein the second energy source is a substrate bias source.

20. The system of claim 16, wherein selectively adjusting further comprises adjusting at least one operating parameter selected from a group of operating parameters consisting of a power output magnitude, a power output frequency, a power source activity state, and a power source activity duration.

* * * * *